United States Patent
Ho et al.

(10) Patent No.: US 7,339,268 B1
(45) Date of Patent: Mar. 4, 2008

(54) THERMAL DISSIPATION FROM A FLIP CHIP THROUGH AN APERTURE IN A FLEX CABLE

(75) Inventors: Shufun Ho, Fremont, CA (US); Alex Y. Tsay, Fremont, CA (US); Ali Hosseinzadeh, Fremont, CA (US); Dennis W. Hogg, Laguna Hills, CA (US); Chee Shu Tay, Petaling Jaya (MY)

(73) Assignee: Western Digital Technologies, Inc., Lake Forest, CA (US)

( * ) Notice: Subject to any disclaimer, the term of this patent is extended or adjusted under 35 U.S.C. 154(b) by 1 day.

(21) Appl. No.: 11/500,567

(22) Filed: Aug. 8, 2006

(51) Int. Cl.
*H01L 23/34* (2006.01)
(52) U.S. Cl. .................... 257/712; 257/737
(58) Field of Classification Search ............ 257/712, 257/737
See application file for complete search history.

(56) References Cited

U.S. PATENT DOCUMENTS

| | | | |
|---|---|---|---|
| 5,397,921 A * | 3/1995 | Karnezos | 257/779 |
| 5,420,460 A * | 5/1995 | Massingill | 257/693 |
| 6,156,980 A | 12/2000 | Peugh et al. | |
| 6,255,143 B1 | 7/2001 | Briar | |
| 6,756,684 B2 | 6/2004 | Huang | |
| 2001/0026955 A1 | 10/2001 | Briar | |
| 2005/0093181 A1 | 5/2005 | Brandenberg et al. | |

* cited by examiner

*Primary Examiner*—Roy Potter
(74) *Attorney, Agent, or Firm*—Carr & Ferrell LLP

(57) ABSTRACT

A semiconductor die mounted to a flex cable is provided. The flex cable comprises a heat sink layer and a flex cable substrate having conductive traces disposed thereon. The flex cable substrate includes an aperture aligned with the semiconductor die. A thermal conductor disposed within the aperture contacts both the semiconductor die and the heat sink layer. The thermal conductor can comprise, for example, a set of solder balls.

11 Claims, 3 Drawing Sheets

THERMAL DISSIPATION FROM A FLIP CHIP THROUGH AN APERTURE IN A FLEX CABLE

BACKGROUND OF THE INVENTION

1. Field of the Invention

The present invention relates generally to the field of disk drives and more particularly to heat dissipation from amplifiers in the read/write circuitry thereof.

2. Description of the Prior Art

Disk drives store and retrieve data for digital electronic apparatuses such as computers. A typical magnetic disk drive comprises a head, including a slider and a transducer, in very close proximity to a surface of a rotatable magnetic disk. The transducer, in turn, includes a write element and/or a read element. As the magnetic disk rotates beneath the head, a very thin air bearing is formed between the surface of the magnetic disk and an air bearing surface of the slider. The write element and the read element can be alternately employed to write and read data while an actuator assembly positions the heads along desired magnetic "tracks" on the magnetic disk.

One or more heads are assembled with an actuator assembly and a flex cable assembly to form a head stack assembly (HSA), with the heads electrically connected to the disk drive circuits via the flex cable. Typically, a preamplifier is located on the flex cable in order to amplify signals being read from the disk. As data transfer rates increase, these preamplifiers consume more power and generate more waste heat that must be dissipated. Accordingly, what is needed is better heat dissipation from preamplifiers on flex cables in disk drives.

SUMMARY

An exemplary flex cable of the present invention comprises a heat sink layer, such as an aluminum stiffener, a flex cable substrate comprising a flexible dielectric material disposed on the heat sink layer, and conductive traces disposed upon the flex cable substrate. The flex cable substrate includes an aperture disposed therethrough. The exemplary flex cable further comprises a semiconductor die, such as a flip-chip preamplifier, that includes bonding pads. A first set of solder balls connects the bonding pads of the semiconductor die to the conductive traces on the flex cable substrate. The aperture in the flex cable substrate is aligned with the semiconductor die and a thermal conductor is disposed within the aperture. The thermal conductor contacts both the semiconductor die and the heat sink layer. In one embodiment, the thermal conductor comprises a second set of solder balls.

DETAILED DESCRIPTION OF THE INVENTION

Figure 1:
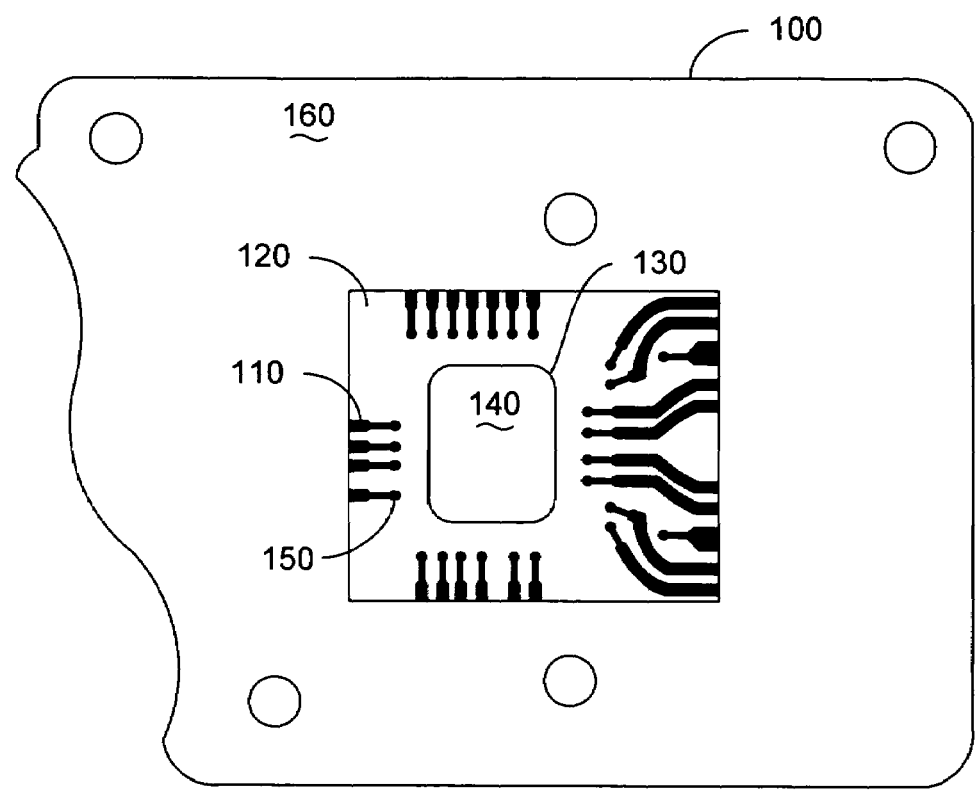
FIG. 1 shows a top view of a flex cable according to an embodiment of the present invention.

FIG. 1 shows a top view of a flex cable 100 according to an exemplary embodiment of the present invention. The flex cable 100 comprises a plurality of conductive traces 110 disposed upon a flex cable substrate 120. The flex cable substrate 120 includes an aperture 130, disposed therethrough, that exposes a heat sink layer 140. Each conductive trace 110 terminates with a bonding pad 150, and the bonding pads 150 are arranged around the aperture 130. A protective cover film 160 overlies the conductive traces 110 on the flex cable substrate 120. An opening in the protective cover 160 exposes the bonding pads 150 and the aperture 130.

Figure 2:
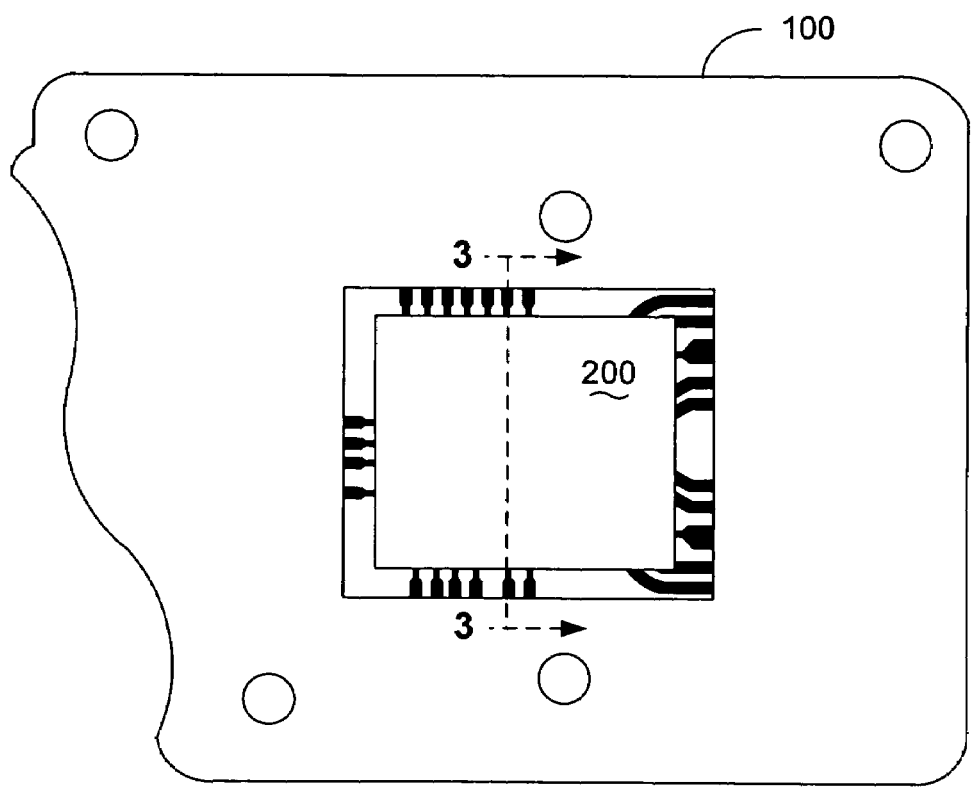
FIG. 2 shows a top view of a semiconductor die mounted on the flex cable of FIG. 1, according to an embodiment of the present invention.
Figure 3:
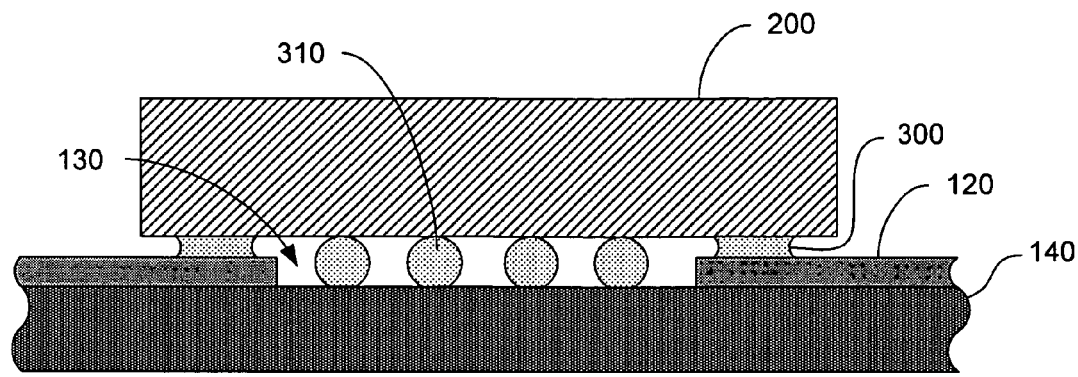
FIGS. 3-6 show cross-sectional views taken along the line 3-3 in FIG. 2, according to various alternative embodiments of the present invention.

FIG. 2 shows a top view of an exemplary semiconductor die 200 mounted on the flex cable 100 of FIG. 1, and FIG. 3 shows a cross-sectional view of the semiconductor die 200 and flex cable 100 taken along the line 3-3 in FIG. 2. The protective cover film 160 and conductive traces 110 have been omitted from FIG. 3 for clarity. The semiconductor die 200 can be, for example, a preamplifier. The semiconductor die 200 can also be a flip-chip. The semiconductor die 200 is electrically connected to the read/write circuitry by a set of solder balls 300 that connect the bonding pads (not shown) of the semiconductor dies 200 to the bonding pad 150 of the conductive traces 110.

The heat sink layer 140, in some embodiments, comprises a stiffener to provide a degree of rigidity to the flex cable 100. Suitable materials for the heat sink layer 140 include aluminum and stainless steel. The flex cable substrate 120 comprises a flexible dielectric material, such as polyimide, to electrically insulate the conductive traces 110 from the heat sink layer 140. The aperture 130 in the flex cable substrate 120 can be formed, for example, by conventional semiconductor processing techniques such as masking and etching. By being essentially centered within an area defined by the bonding pads 150, the aperture 130 is aligned with the semiconductor die 200 when the semiconductor die 200 is mounted onto the flex cable 100.

The flex cable 100 also comprises a thermal conductor disposed within the aperture 130 and contacting both the semiconductor die 200 and the heat sink layer 140. Various alternatives for the thermal conductor are shown in FIGS. 3-6, discussed below. The function of the thermal conductor is to create a conduit to dissipate heat from the semiconductor die 200 to the heat sink layer 140. The heat sink layer 140, in some embodiments, conducts the heat away to an actuator of a head stack assembly. Accordingly, a material characterized by a high thermal conductivity, such as a metallic material, is desired for the thermal conductor. Suitable materials include solder and the material of the heat sink layer 140, such as aluminum and stainless steel. Thermally conductive non-metallic materials, such as certain filled epoxies, also can be used.

In FIG. 3 an exemplary thermal conductor comprises a set of solder balls 310, and preferably the set comprises a dense array of closely spaced solder balls 310. In some embodiments, the solder balls 310 are formed contemporaneously with the solder balls 300 when the semiconductor die 200 is mounted on the flex cable 100. Because of the thickness of the flex cable substrate 120, and the differences of solder wettability between the heat sink layer 140 and the bonding pads 150, the solder balls 310 can be shaped differently than the solder balls 300. As shown in FIG. 3, the solder balls 310 are thicker than the solder balls 300, for example.

In FIG. 3, because the solder balls 310 connect the semiconductor die 200 to the heat sink layer 140, and not to the conductive traces 110, the solder balls 310 are not electrically connected to the bonding pads of the semiconductor die 200. Rather, the solder balls 310 contact the backside of the semiconductor die 200 (i.e., the side of the semiconductor die 200 that includes the bonding pads) in a central region of the backside, while the bonding pads are disposed around the periphery of the backside. In some embodiments, small apertures in a silicon nitride coating on the backside of the semiconductor die 200 allow the solder balls 310 to wet to the silicon substrate of the semiconductor die 200. This provides a good mechanical bond and good thermal conductivity across the interface between each solder ball 310 and the silicon substrate.

Figure 7:
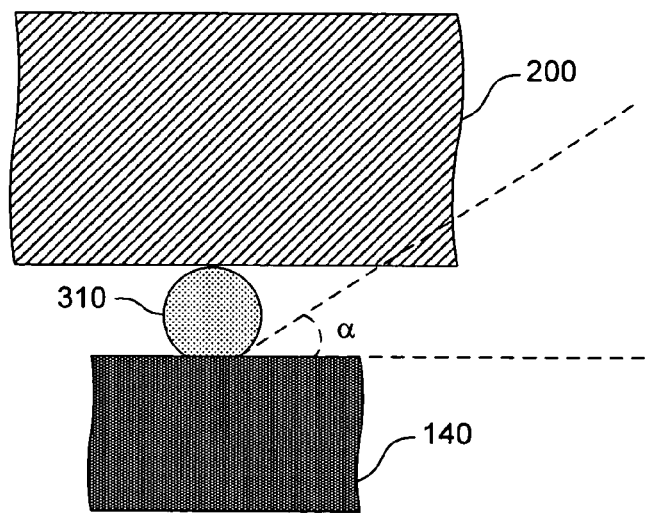
FIG. 7 shows a cross-sectional view of a solder ball between a semiconductor die and a heat sink layer, according to an embodiment of the present invention.

The wettability of solder to many metals, such as aluminum and stainless steel, is low due to the native oxide layers on these metals, as compared with those materials typically used for bonding pads, such as gold. Accordingly, in some embodiments and as shown in FIG. 7, a contact angle, α, between the heat sink layer 140 and the solder balls 310 is less than 90°. Lower wettability, however, can be advantageous for the purpose of forming the thermal conductor. Specifically, the solder balls 310 do not tend to spread on the heat sink layer 140, which otherwise can lead to the collapse of the solder balls and a loss of contact between the solder balls and the semiconductor die 200.

Figure 4:
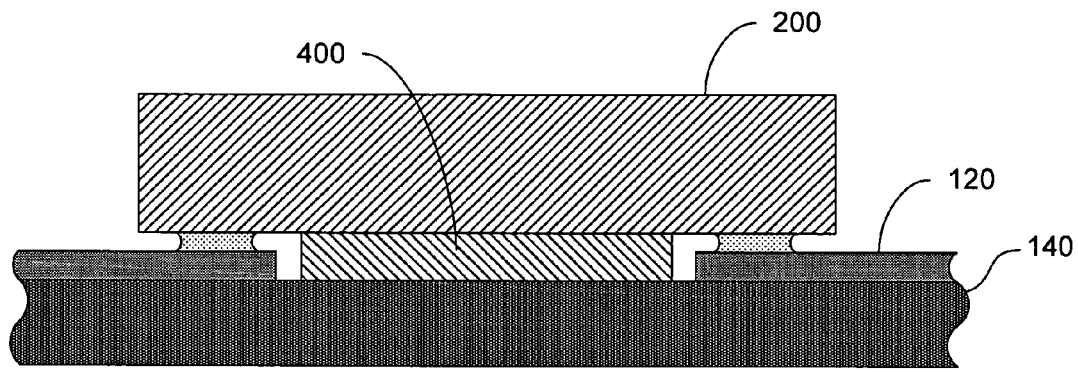

FIG. 4 shows a cross-sectional view of an exemplary embodiment in which the thermal conductor comprises a spacer 400, such as a metal disk. The spacer 400 can be placed in the aperture 130 prior to mounting the semiconductor die 200 to the flex cable 100. In some embodiments the spacer 400 contacts both the semiconductor die 200 and the heat sink layer 140 without being bonded to either. In other embodiments, the spacer 400 is adhered to either or both of the semiconductor die 200 and the heat sink layer 140, for example, with a thermally conductive epoxy or solder.

Figure 5:
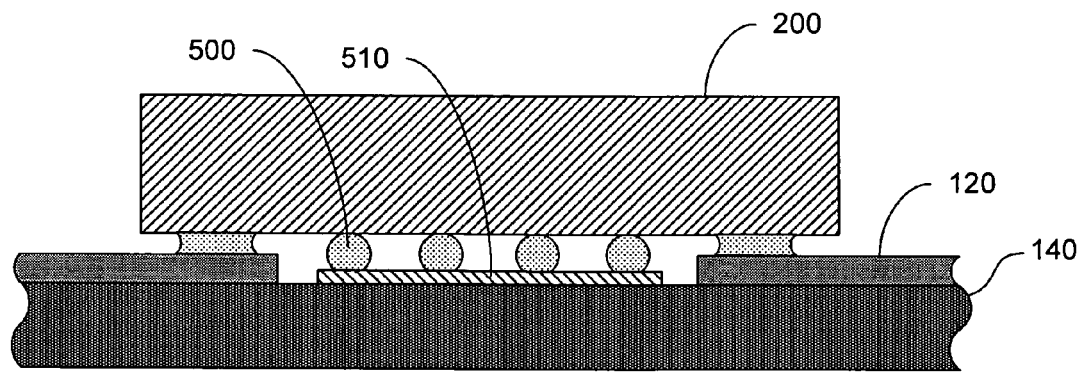

FIG. 5 shows a cross-sectional view of an exemplary embodiment in which the thermal conductor comprises a set of solder balls 500 and a spacer 510. The solder balls 500 are in contact with the semiconductor die 200 and the spacer 510. The spacer 510 is, in turn, in contact with the heat sink layer 140. As above, the spacer 510 can be placed in the aperture 130 prior to mounting the semiconductor die 200 to the flex cable 100 and can be either bonded or not bonded to the heat sink layer 140. In some embodiments, the spacer 510 is a deposited layer that is formed on the heat sink layer 140. Preferably, the spacer 510 is formed of a metal that solder does not wet well, for the reasons discussed above with respect to FIG. 3.

Figure 6:
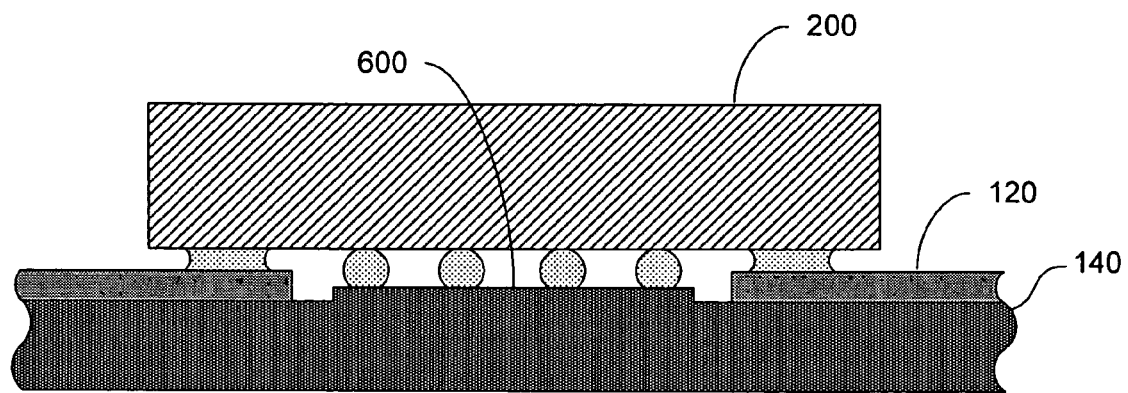

FIG. 6 shows a cross-sectional view of an exemplary embodiment in which the thermal conductor comprises a pedestal 600 of the heat sink layer 140. It will be appreciated that in the embodiment of FIG. 4 the spacer 400 can also be a pedestal of the heat sink layer 140. The pedestal 600 can be formed, for example, by masking and etching the heat sink layer 140 to remove material around the pedestal 600 to a desired depth before forming the flex cable substrate 120 on the heat sink layer 140. The pedestal 600 can also be formed by traditional metal-working techniques such as stamping.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A flex cable comprising:
a heat sink layer;
a semiconductor die including bonding pads;
a flex cable substrate comprising a flexible dielectric material, the flex cable substrate disposed between the heat sink layer and the semiconductor die and having an aperture disposed therethrough and aligned with the semiconductor die;
conductive traces disposed upon the flex cable substrate;
a first set of solder balls connecting the bonding pads to the conductive traces; and
a thermal conductor disposed within the aperture and contacting both the semiconductor die and the heat sink layer.

2. The flex cable of claim 1 wherein the heat sink layer comprises aluminum.

3. The flex cable of claim 1 wherein the heat sink layer comprises stainless steel.

4. The flex cable of claim 1 wherein the heat sink layer comprises a stiffener.

5. The flex cable of claim 1 wherein the semiconductor die comprises a preamplifier.

6. The flex cable of claim 1 wherein the semiconductor die comprises a flip chip.

7. The flex cable of claim 1 wherein the thermal conductor includes a second set of solder balls.

8. The flex cable of claim 7 wherein the thermal conductor further includes a thermally conductive layer disposed between the second set of solder balls and the heat sink layer.

9. The flex cable of claim 7 wherein the second set of solder balls are not electrically connected to the bonding pads.

10. The flex cable of claim 7 wherein a contact angle between the heat sink layer and the solder balls of the second set is less than 90°.

11. The flex cable of claim 1 wherein the stiffener further includes a pedestal disposed within the aperture.

* * * * *